US012538564B2

(12) United States Patent
Wu et al.

(10) Patent No.: US 12,538,564 B2
(45) Date of Patent: Jan. 27, 2026

(54) HETEROGENEOUS INTEGRATION CAPACITOR AND MoM CAPACITOR

(71) Applicant: National Tsing Hua University, Hsinchu (TW)

(72) Inventors: Ho-Chun Wu, Hsinchu (TW); Yin-Cheng Chang, Hsinchu (TW); Shuo-Hung Hsu, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 370 days.

(21) Appl. No.: 18/344,820

(22) Filed: Jun. 29, 2023

(65) Prior Publication Data

US 2024/0347532 A1    Oct. 17, 2024

(30) Foreign Application Priority Data

Apr. 12, 2023  (TW) .................... 112113724

(51) Int. Cl.
*H10D 84/00* (2025.01)
*H10D 1/66* (2025.01)
*H10D 1/68* (2025.01)

(52) U.S. Cl.
CPC ............. *H10D 84/212* (2025.01); *H10D 1/66* (2025.01); *H10D 1/714* (2025.01)

(58) Field of Classification Search
CPC ........... H10D 84/212; H10D 1/66; H10D 1/71
See application file for complete search history.

(56) References Cited

U.S. PATENT DOCUMENTS

| 2006/0081892 A1* | 4/2006 | Tateyama | H03B 5/366 |
| | | | 257/E29.345 |
| 2008/0054401 A1 | 3/2008 | Park | |
| 2016/0260706 A1 | 9/2016 | Kawabata et al. | |
| 2017/0301675 A1* | 10/2017 | Harjani | H10D 1/66 |
| 2019/0385947 A1 | 12/2019 | Li et al. | |
| 2020/0286823 A1 | 9/2020 | Wang et al. | |

FOREIGN PATENT DOCUMENTS

| CN | 105449007 | 3/2016 |
| TW | 201030947 | 8/2010 |
| TW | 202211325 | 3/2022 |

OTHER PUBLICATIONS

"Office Action of Taiwan Counterpart Application", issued on Nov. 7, 2023, p. 1-p. 13.

* cited by examiner

*Primary Examiner* — Samuel A Gebremariam
(74) *Attorney, Agent, or Firm* — JCIPRNET

(57) ABSTRACT

A heterogeneous integration capacitor and a metal-oxide-metal (MoM) capacitor are provided. The heterogeneous integration capacitor has a first electrode and a second electrode, and includes a substrate, a semiconductor capacitor, the MoM capacitor, and a metal-insulator-metal (MiM) capacitor. These capacitors are sequentially formed on the substrate, and are formed as connected in parallel.

19 Claims, 11 Drawing Sheets

HETEROGENEOUS INTEGRATION CAPACITOR AND MoM CAPACITOR

CROSS-REFERENCE TO RELATED APPLICATION

This application claims the priority benefit of Taiwan application serial no. 112113724, filed on Apr. 12, 2023. The entirety of the above-mentioned patent application is hereby incorporated by reference herein and made a part of this specification.

BACKGROUND

Technical Field

The disclosure relates to a capacitor structure, and particularly relates to a heterogeneous integration capacitor and a metal-oxide-metal (MoM) capacitor.

Description of Related Art

In the field of semiconductor technology, a capacitor is a very common component, which has a place in many aspects, for example, in semiconductor manufacturing, integrated circuit design, circuit packaging design, and electronic circuit system.

However, if a high unit capacitance value is to be obtained, the grain size becomes large, the board material of circuit packaging increases, and the parasitic capacitance effect also increases. Currently, a unit capacitance value of an external discrete component is small, the volume occupied by the component is large, and the parasitic effect is large.

Therefore, there is a need to develop a heterogeneous integration capacitor having a high capacitance value.

SUMMARY

Based on the above description, the disclosure provides a heterogeneous integration capacitor, which can increase the unit capacitance value, reduce the grain size, reduce the circuit board material of the circuit packaging, and at the same time reduce the parasitic effect and the cost of external capacitor.

According to an embodiment of the disclosure, a heterogeneous integration capacitor is provided, which has a first electrode and a second electrode, and includes a substrate, a semiconductor capacitor, a metal-oxide-metal (MoM) capacitor, and a metal-insulator-metal (MiM) capacitor. The semiconductor capacitor, the MoM capacitor, and the MiM capacitor are sequentially formed on the substrate. The semiconductor capacitor, the MoM capacitor, and the MiM capacitor are formed as connected in parallel.

According to another embodiment of the disclosure, an MoM capacitor is provided, which includes a first metal layer including a first comb-like portion and a second comb-like portion, in which the first comb-like portion includes a first body portion extending in a first direction and a plurality of first extension portions extending in a second direction, the second comb-like portion includes a second body portion extending in the first direction and a plurality of second extension portions extending in the second direction, each of the plurality of first extension portions and each of the plurality of second extension portions are arranged alternately with each other, and the first direction is approximately orthogonal to the second direction; a second metal layer positioned above the first metal layer, the second metal layer includes a first extension portion, a second extension portion, a plurality of third extension portions between the first extension portion and the second extension portion, and a plurality of fourth extension portions between the first extension portion and the second extension portion, the first extension portion, the second extension portion, the plurality of third extension portions, and the plurality of fourth extension portions extend in the first direction, and each of the plurality of third extension portions and each of the plurality of fourth extension portions are arranged alternately with each other; a third metal layer positioned above the second metal layer, in which the third metal layer includes a first comb-like portion and a second comb-like portion, the first comb-like portion includes a first body portion extending in the first direction and a plurality of first extension portions extending in the second direction, the second comb-like portion includes a second body portion extending in the first direction and a plurality of second extension portions extending in the second direction, and each of the plurality of first extension portions and each of the plurality of second extension portions are arranged alternately with each other; oxidation layers positioned between the first metal layer and the second metal layer and between the second metal layer and the third metal layer. The first body portion of the first comb-like portion of the first metal layer and the first extension portion of the second metal layer are electrically connected to each other through a plurality of vias, and the first extension portion of the second metal layer and the first body portion of the first comb-like portion of the third metal layer are electrically connected to each other through a plurality of vias, thereby the first body portion of the first metal layer, the first extension portion of the second metal layer, and the first body portion of the third metal layer are electrically connected to each other, and are used as an electrode of the MoM capacitor. The second body portion of the second comb-like portion of the first metal layer and the second extension portion of the second metal layer are electrically connected to each other through a plurality of vias, and the second extension portion of the second metal layer and the second body portion of the second comb-like portion of the third metal layer are electrically connected to each other through a plurality of vias, thereby the second body portion of the first metal layer, the second extension portion of the second metal layer, and the second body portion of the third metal layer are electrically connected, and are used as another electrode of the MoM capacitor. Intersections of the respective first extension portions of the first metal layer and the respective third extension portions of the second metal layer are electrically connected to each other through a plurality of vias, and intersections of the respective third extension portions of the second metal layer and the respective first extension portions of the third metal layer are electrically connected to each other through a plurality of vias. Intersections of the respective second extension portions of the first metal layer and the respective fourth extension portions of the second metal layer are electrically connected to each other through a plurality of vias, and intersections of the respective fourth extension portions of the second metal layer and the respective second extension portions of the third metal layer are electrically connected to each other through a plurality of vias.

Based on the heterogeneous integration capacitor, a capacitor with a high unit capacitance value may be provided by integrating the three types of capacitors of the MiM capacitor, the MoM capacitor, and the semiconductor capacitor connected in parallel.

DESCRIPTION OF THE EMBODIMENTS

Generally speaking, three types of capacitors are provided in the CMOS process, which are metal-insulator-metal (MiM) capacitors, metal-oxide-metal (MoM) capacitors, and semiconductor capacitors. The semiconductor capacitors may adopt metal-oxide-semiconductor (MOS) capacitors, varactors, or depletion-type MOS capacitors. The following uses the MOS capacitor as an example for description. The disclosure provides a new heterogeneous integration capacitor, which integrates the three types of capacitors into one capacitor. Architectures of the three types of capacitors will be briefly described below.

Figure 1:
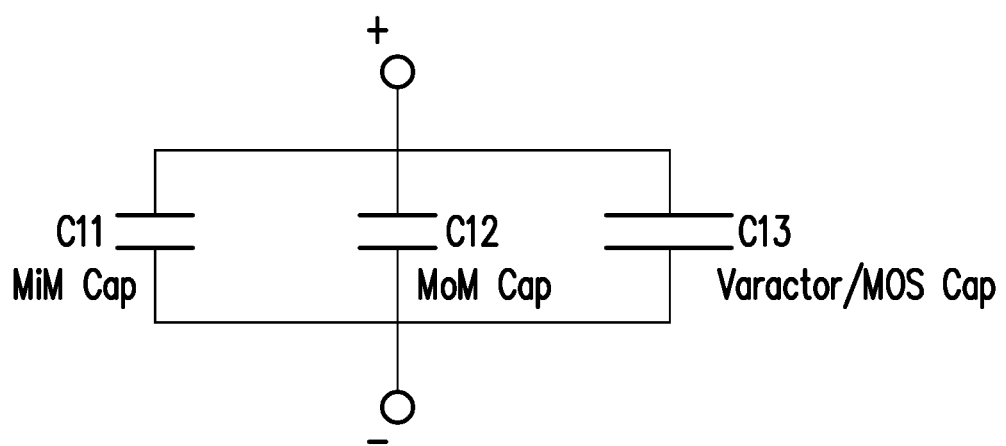
FIG. 1 illustrates a schematic diagram of an equivalent circuit of a heterogeneous integration capacitor according to an embodiment of the disclosure.

FIG. 1 illustrates a schematic diagram of an equivalent circuit of a heterogeneous integration capacitor according to an embodiment of the disclosure. According to the embodiment of the disclosure, a heterogeneous integration capacitor C is a heterogeneous integration capacitor in which the three types of capacitors, which are an MiM capacitor C11, an MoM capacitor C12, and a varactor or an MOS capacitor C13, are connected in parallel. Thereby, a unit area capacitance value can be increased.

Figure 2:
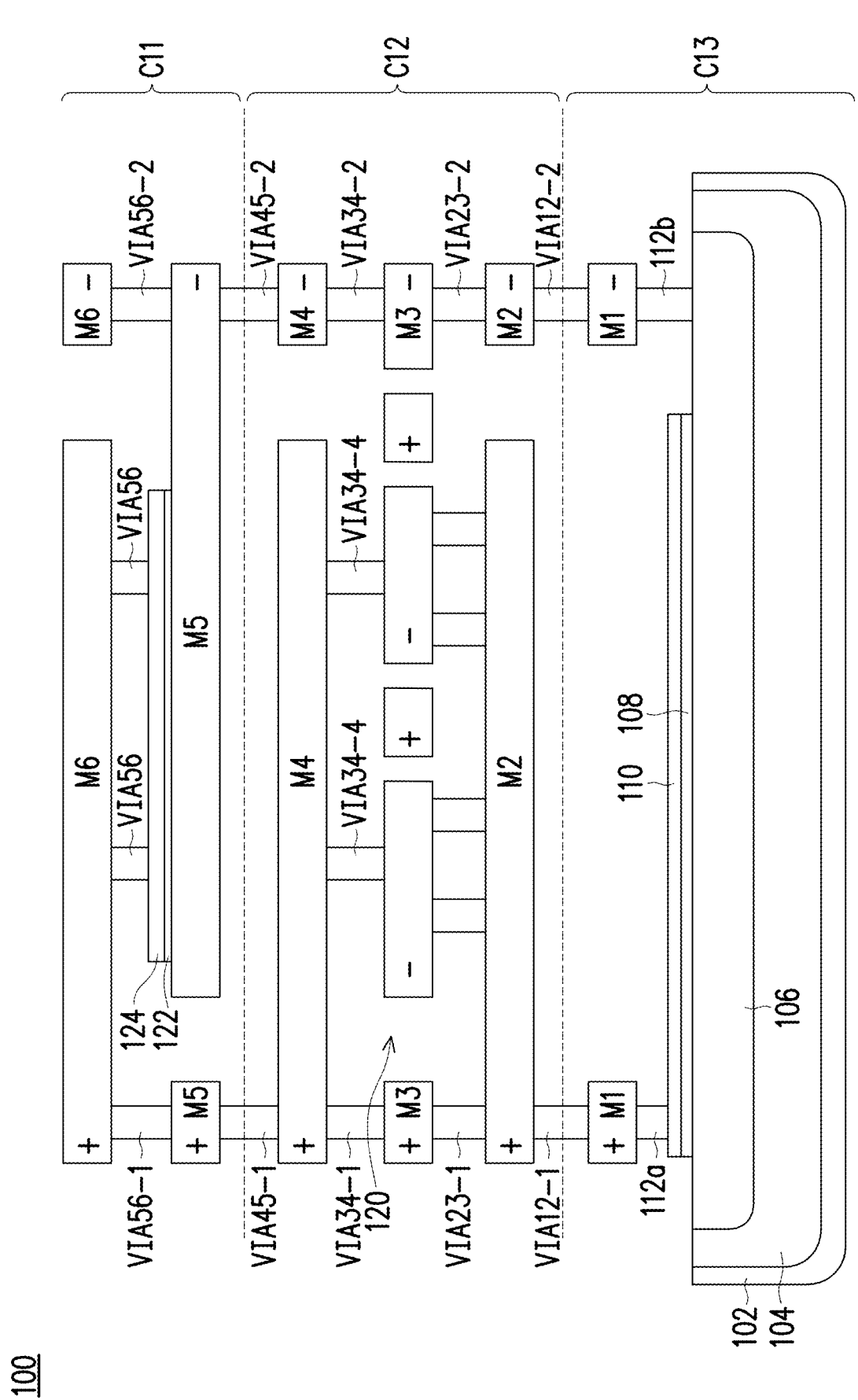
FIG. 2 illustrates a schematic diagram of a semiconductor structure of a heterogeneous integration capacitor according to an embodiment of the disclosure.

FIG. 2 illustrates a schematic diagram of a semiconductor structure of a heterogeneous integration capacitor according to an embodiment of the disclosure. The embodiment is of the three types of capacitors, which are the MiM capacitor C11, the MoM capacitor C12, and the varactor or the MOS capacitor C13, connected in parallel.

As shown in FIG. 2, a heterogeneous integration capacitor 100 is formed on a semiconductor substrate 102, according to which the MOS capacitor C13, the MoM capacitor C12, and the MiM capacitor C11 are formed. A well region 104 is provided in the semiconductor substrate 102, such as an N-type well region 104. A P+ diffusion region 106 is provided in the N-type well region 104. The semiconductor substrate 102 further has an oxidation layer 108 (that is, a gate oxidation layer in the MOS process) and a polysilicon layer 110. Thereby, a varactor or a MOS capacitor is formed by the P+ diffusion region 106, the oxidation layer 108, and the polysilicon layer 110. Structures of the MOS capacitor C13, the MoM capacitor C12, and the MiM capacitor C11 will be briefly described below, and the detailed description will be described in conjunction with the following embodiments.

In addition, the polysilicon layer 110 is electrically connected to a first part of a metal layer M1 via a contact via 112a (a part marked "+" in FIG. 2 is used as a positive electrode (a first electrode) in this example, and the respective metal layers M1 to M6 are marked in the same way), and the P+ diffusion region 106 is electrically connected to a second part of the metal layer M1 via a contact via 112b (a part marked "−" in FIG. 2 is used as a negative electrode (a second electrode) in this example). In the following descriptions, the respective metal layers M1 to M6 are marked in the same way, and may be referred to each other. As described later, the first part of the metal layer M1 is electrically connected to respective first parts of the metal layers M2 to M6 via vias VIA12-1, VIA23-1, VIA34-1, VIA45-1, and VIA56-1 sequentially. In this example, a high voltage may be applied to the metal layer M6 to be used as a positive electrode (+) of the heterogeneous integration capacitor 100. In addition, the second part (−) of the metal layer M1 is electrically connected to respective second parts of the metal layers M2 to M6 via vias VIA12-2, VIA23-2, VIA34-2, VIA45-2, and VIA56-2 sequentially. In this example, a low voltage may be applied to a second part of the metal layer M6 to be used as a negative electrode (−) of the heterogeneous integration capacitor 100.

As shown in FIG. 2, the MoM capacitor C12 includes the metal layer M2, the metal layer M3, and the metal layer M4. Oxidation layers 120 are filled between the metal layer M2 and the metal layer M3 and between the metal layer M3 and the metal layer M4. The first part (+) of the metal layer M2 is electrically connected to the first part (+) of the metal layer M3 via the via VIA23-1, and the second part (−) of the metal layer M2 is electrically connected to the second part (−) of the metal layer M3.

In addition, vias are further used to electrically connect between the metal layer M3 and the metal layer M4 and between the metal layer M2 and the metal layer M3 (only vias VIA34-4 and VIA23-4 are shown in FIG. 2). Since in an embodiment, the metal layer M3 may include a plurality of extension portions extending in a direction, so through being electrically connected to the upper and the lower metal layers M2 and M3 through the vias, the plurality of extension portions may be alternately connected to positive and negative electric potentials. Therefore, a plurality of capacitors may be formed by the plurality of vias between the metal layer M3 and the metal layer M4 and between the metal layer M2 and the metal layer M3 and the oxidation layers 120 therebetween, thereby increasing a capacitance value of the MoM capacitor. This structure example will be further described in detail later.

In this example, the MoM capacitor C12 comprises three metal layers (M2, M3, and M4), but in practical applications, more metal layers may be designed to form the MoM capacitor C12. In addition, example diagrams of several structures of the MoM capacitor C12 will be given below. Similarly, in the following examples, the MoM capacitor C12 still comprises the three metal layers (M2, M3, and M4). However, the MoM capacitor C12 may include more layers of metal layers, for example, more layers of the metal layer M3 may be disposed between the metal layers M2 and M4.

As shown in FIG. 2, the MiM capacitor C11 comprises a metal layer M5, a metal layer 124, and an insulating layer 122 between the metal layer M5 and the metal layer 124. A first part (+) of the metal layer M5 is electrically connected upward to the metal layer M6 via a via V56-1, and is electrically connected downward to a first part (+) of the metal layer M4 of the MoM capacitor C12 via a via V45-1. A second part (−) of the metal layer M5 is electrically connected upward to the metal layer M6 via a via V56-2, and is electrically connected downward to a second part (+) of the metal layer M4 of the MoM capacitor C12 via a via V45-2. In addition, the metal layer 124 forming an electrode of the MiM capacitor C11 is connected to the metal layer M6 via a via VIA56. The metal layer 124, which is used as a positive electrode of the MiM capacitor C11, is electrically connected upward to the metal layer M6 via the via VIA56, and then electrically connected downward to the first part (+) of the metal layer M5 via the via VIA56-1.

As mentioned above, the positive electrode of the MiM capacitor C11 may be electrically connected to the positive electrode of the MoM capacitor C12, and the negative electrode of the MiM capacitor C11 may be electrically connected to the negative electrode of the MoM capacitor C12. In this way, the MiM capacitor C11 and the MoM capacitor C12 form a structure connected in parallel.

Here, the cross-sectional diagram of the heterogeneous integration capacitor 100 shown in FIG. 2 is just an example, and the implementation manner of the disclosure is not limited to this structure. In addition, the positive electrode and the negative electrode shown in FIG. 2 are only an example, and in fact, the opposite configuration may also be possible, and the disclosure is not limited thereto. In addition, the number of vias in respective layers shown in FIG. 5 is not limited, and the number may be increased or decreased depending on the actual implementation method, so as to achieve the effect of increasing the unit area capacitance value.

Figure 3A:
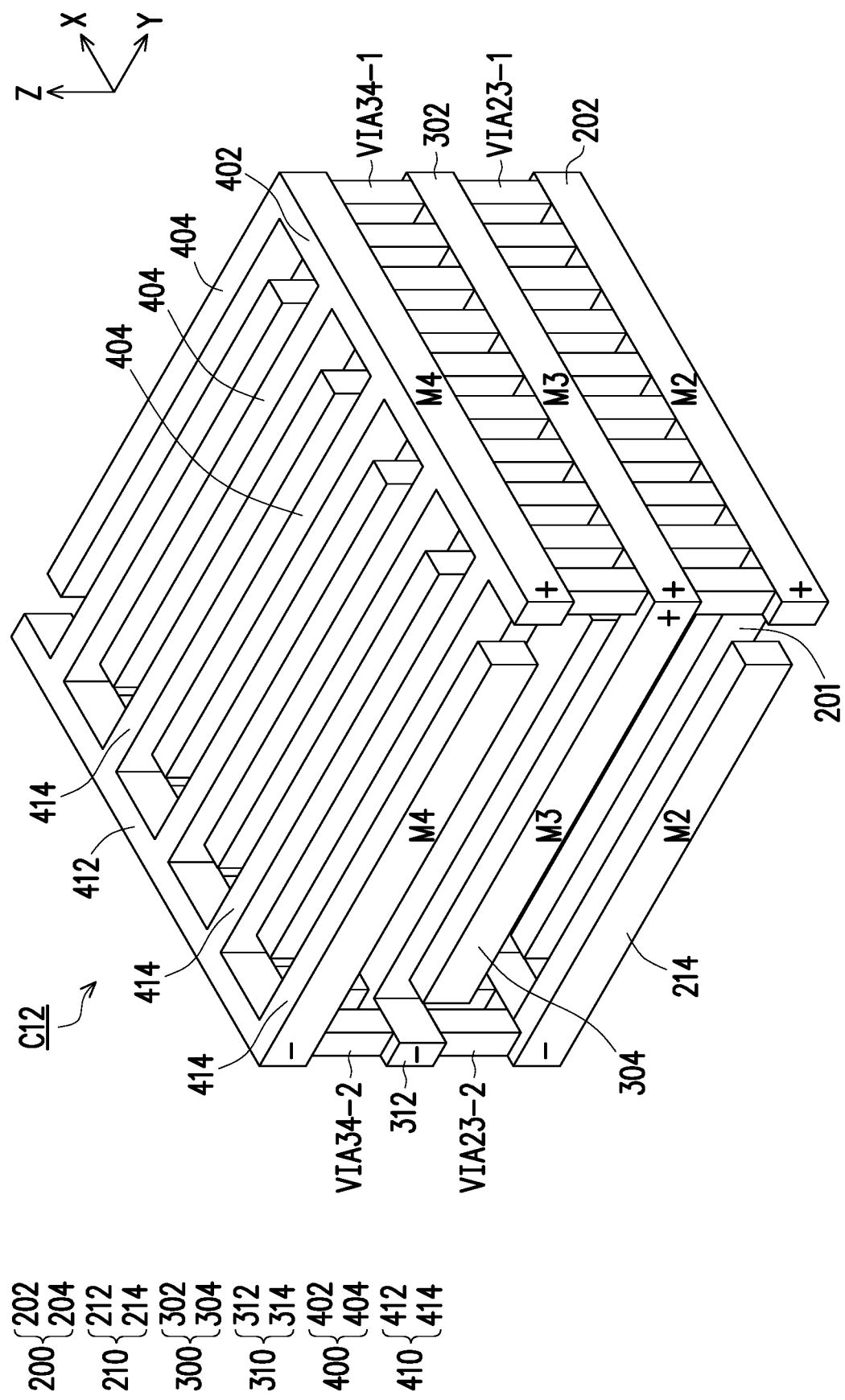
FIG. 3A illustrates a schematic diagram of a structure of a metal-oxide-metal (MoM) capacitor in a heterogeneous integration capacitor according to an embodiment of the disclosure.
Figure 3B:
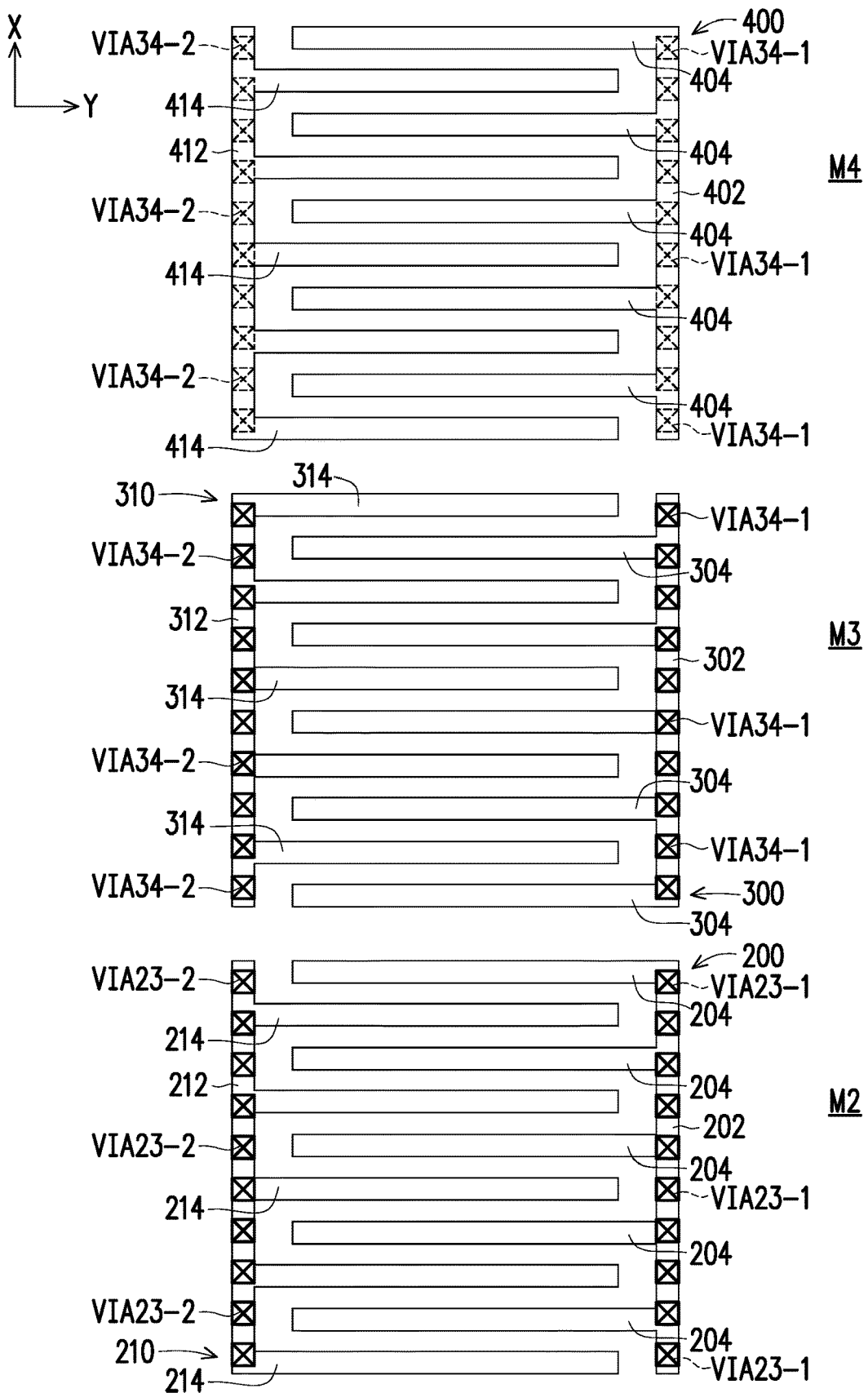
FIG. 3B illustrates a top view of each layer structure of the MoM capacitor in FIG. 3A.

FIG. 3A illustrates a schematic diagram of a structure of an MoM capacitor in a heterogeneous integration capacitor according to an embodiment of the disclosure, and FIG. 3B illustrates a top view of each layer structure of the MoM capacitor in FIG. 3A. The MoM capacitor C12 shown in FIG. 3A and FIG. 3B is just an exemplary structure, which does not necessarily correspond to FIG. 2. FIG. 2 is only a cross-sectional schematic diagram illustrating a connection relationship between capacitors in the heterogeneous integration capacitor 100.

As shown in FIG. 3A and FIG. 3B, the MoM capacitor C12 of the heterogeneous integration capacitor 100 includes the metal layer M2, the metal layer M3, and the metal layer M4. In addition, although it is not clearly illustrated in FIG. 3, oxidation layers (such as the oxidation layers 120 shown in FIG. 2) are filled between the metal layer M2 and the metal layer M3 and between the metal layer M3 and the metal layer M4 to be used as dielectric layers of the MoM capacitor C12.

The metal layer M2 (a first metal layer of the MoM capacitor C12) includes a first comb-like portion 200 and a second comb-like portion 210. The first comb-like portion 200 includes a first body portion 202 and a plurality of first extension portions 204 branched from the first body portion 202, in which in an embodiment, the first body portion 202 may be arranged to extend along an X direction (a first direction), and the plurality of first extension portions 204 may be arranged to extend along a Y direction (a second direction) and be approximately parallel to each other. The second comb-like portion 210 also includes a second body portion 212 and a plurality of second extension portions 214 branched from the second body portion 212, in which in an embodiment, the second body portion 212 may be arranged to extend along the X direction, and the plurality of second extension portions 214 may be arranged to extend along the Y direction and be approximately parallel to each other. Here, the plurality of first extension portions 204 of the first comb-like portion 200 and the plurality of second extension portions 214 of the second comb-like portion 210 are arranged alternately with each other. In addition, in an example, the first comb-like portion 200 is used as the positive electrode part, and the second comb-like portion 210 is used as the negative electrode part. Of course, the disposition of the electrodes may also be reversed, and the disclosure is not limited thereto.

The metal layer M3 (a second metal layer of the MoM capacitor C12) also includes a first comb-like portion 300 and a second comb-like portion 310. The first comb-like portion 300 includes a first body portion 302 and a plurality of first extension portions 304 branched from the first body portion 302, in which in an embodiment, the first body portion 302 may be arranged to extend along the X direction, and the plurality of first extension portions 304 may be arranged to extend along the Y direction and be approximately parallel to each other. The second comb-like portion 310 also includes a second body portion 312 and a plurality of second extension portions 314 branched from the second body portion 312, in which in an embodiment, the second body portion 312 may be arranged to extend along the X direction, and the plurality of second extension portions 314 may be arranged to extend along the Y direction and be approximately parallel to each other. Here, the plurality of first extension portions 304 of the first comb-like portion 300 and the plurality of second extension portions 314 of the second comb-like portion 310 are arranged alternately with each other. In addition, in an example, corresponding to the disposition manner of the metal layer M2, the first comb-like portion 300 is also used as the positive electrode part, and the second comb-like portion 310 is also used as the negative electrode part.

The metal layer M4 (a third metal layer of the MoM capacitor C12) also includes a first comb-like portion 400 and a second comb-like portion 410. The first comb-like portion 400 includes a first body portion 402 and a plurality of first extension portions 404 branched from the first body portion 402, in which in an embodiment, the first body portion 402 may be arranged to extend along the X direction, and the plurality of first extension portions 404 may be arranged to extend along the Y direction and be approximately parallel to each other. The second comb-like portion 410 also includes the second body portion 312 and a plurality of second extension portions 414 branched from a second body portion 412, in which in an embodiment, the second body portion 412 may be arranged to extend along the X direction, and the plurality of second extension portions 414 may be arranged to extend along the Y direction and be approximately parallel to each other. Here, the plurality of first extension portions 404 of the first comb-like portion 400 and the plurality of second extension portions 414 of the second comb-like portion 410 are arranged alternately with each other. In addition, in an example, corresponding to the disposition manner of the metal layers M2 and M3, the first comb-like portion 400 is also used as the positive electrode part, and the second comb-like portion 410 is also used as the negative electrode part.

In addition, in the respective metal layers M2, M3, and M4, the upper and lower disposed positions of the respective first body portions 202, 302, and 402 of the respective first comb-like portions 200, 300, and 400 are approximately corresponding to each other (approximately aligned), and at the same time, the upper and lower disposed positions of the respective second body portions 212, 312, and 412 of the respective second comb-like portions 210, 310, and 410 are approximately corresponding to each other (approximately aligned). In addition, in the respective metal layers M2, M3, and M4, the upper and lower disposed positions of the plurality of first extension portions 204, 304, and 404 of the respective first comb-like portions 200, 300, and 400 are approximately corresponding to each other (approximately aligned), and at the same time, the upper and lower disposed positions of the plurality of second extension portions 214, 314, and 414 of the respective second comb-like portions 210, 310, and 410 are approximately corresponding to each other (approximately aligned).

In addition, on the metal layer M2, the first body portion 202 of the first comb-like portion 200 is disposed with the plurality of vias VIA23-1, which are electrically connected upward to the first body portion 302 of the first comb-like portion 300 in the metal layer M3; the second body portion 212 of the second comb-like portion 210 is disposed with the plurality of vias VIA23-2, which are electrically connected upward to the second body portion 312 of the second comb-like portion 310 in the metal layer M3. Similarly, on the metal layer M3, the first body portion 302 of the first comb-like portion 300 is disposed with the plurality of vias VIA34-1, which are electrically connected upward to the first body portion 402 of the first comb-like portion 400 in the metal layer M4 (see vias marked by dotted lines in the metal layer M4 in FIG. 3B); the second body portion 312 of the second comb-like portion 310 is disposed with the plurality of vias VIA34-2, which are electrically connected upward to the second body portion 412 of the second comb-like portion 410 in the metal layer M4 (see vias marked by dotted lines in the metal layer M4 in FIG. 3B).

In addition, the via VIA45-1 may be disposed on the first body portion 402 of the first comb-like portion 400 of the metal layer M4, and electrically connected upward to the first part (+) of the metal layer M5, and the via VIA45-2 may be disposed on the second body portion 412 of the second comb-like portion 410 of the metal layer M4, and is electrically connected upward to the second part (−) of the metal layer M5, which may refer to the example shown in FIG. 2. Similarly, the via VIA12-1 may be disposed under the first body portion 202 of the first comb-like portion 200 of the metal layer M2, and is electrically connected downward to the first part (+) of the metal layer M1, and the via VIA12-2 may be disposed under the second body portion 212 of the second comb-like portion 210 of the metal layer M2, and is electrically connected downward to the second part (−) of the metal layer M1, which may refer to the example shown in FIG. 2. Thereby, the MoM capacitor C12 is connected upward in parallel with the MiM capacitor C11, and connected downward in parallel with the varactor or the MOS capacitor C13. In other words, the positive electrode of the MoM capacitor C12 may be electrically connected to the positive electrode of the MiM capacitor C11 and the positive electrode of the MOS capacitor C13, and the negative electrode of the MoM capacitor C12 may be electrically connected to the negative electrode of the MiM capacitor C11 and the negative electrode of the MOS capacitor C13. In this way, the MiM capacitor C11, the MoM capacitor C12, and the MOS capacitor C13 are connected in parallel as the heterogeneous integration capacitor 100.

In addition, although not shown, oxidation layers (such as the oxidation layer shown in FIG. 2 as an example) are disposed between the metal layer M2 and the metal layer M3 and between the metal layer M3 and the metal layer M4, which are used as dielectric layers of the MoM capacitor C12. Thereby, capacitances may be formed between the metal layer M2 and the metal layer M3, between the metal layer M3 and the metal layer M4, and between the vias. Therefore, through this type of architecture, a capacitance value of the MoM capacitor C12 can be further increased.

According to the heterogeneous integration capacitor 100 comprising the MoM capacitor C12 in FIG. 3A and FIG. 3B, when compared with the process-integrated passive device (IPD), the results are shown in Table 1. From the comparison of capacitance value simulation results, it may be known that the capacitance value becomes about 5 times.

TABLE 1

Comparison of capacitance value simulation results

| | Area (μm × μm) | Simulation result (pF) | Unit capacitance (pF/μm2) |
|---|---|---|---|
| IPD | 126 × 53 | 4.934 | 0.000738844 |
| Heterogeneous integration capacitor | 51 × 52 | 9.044 | 0.003410256 |

Figure 4A:
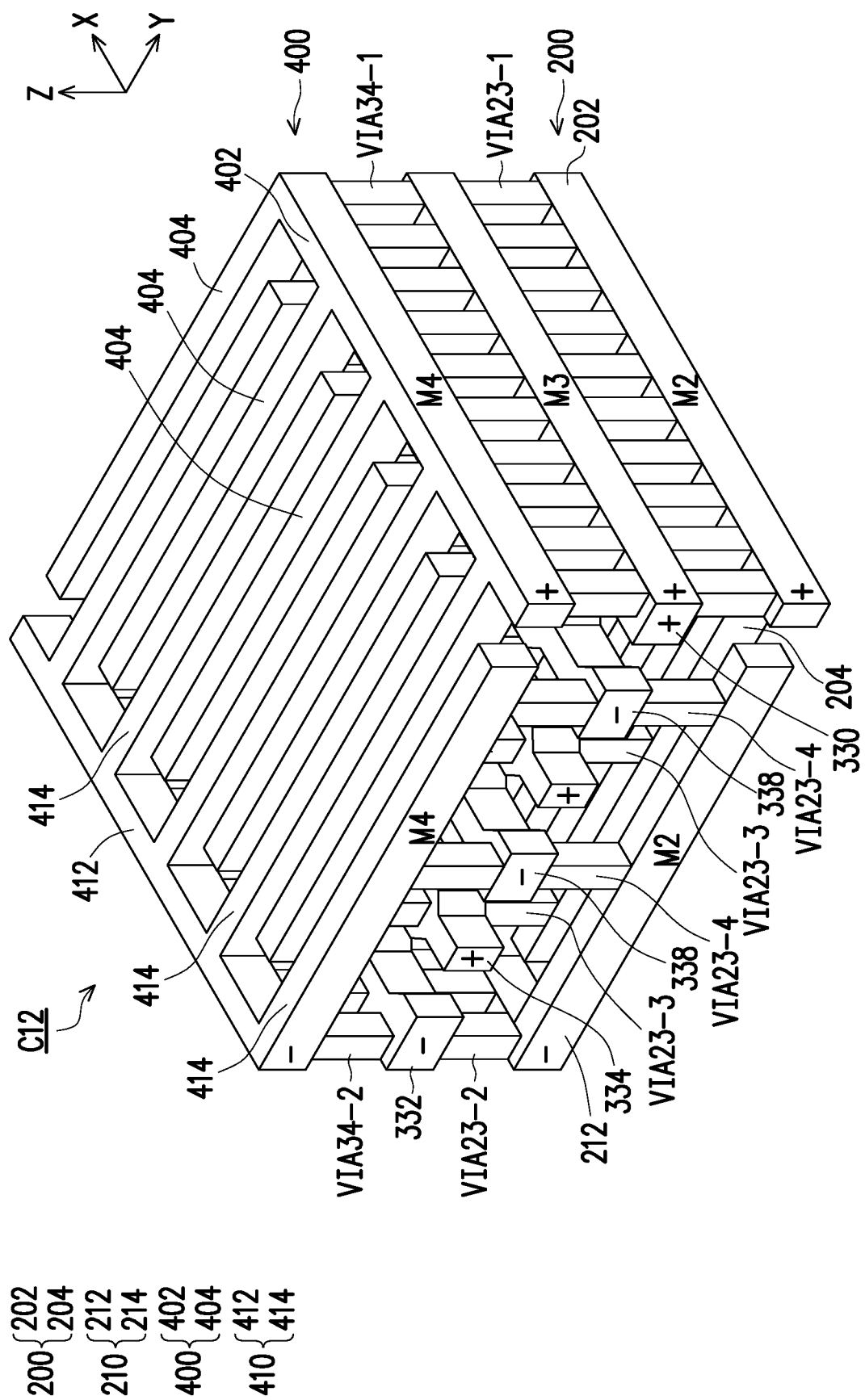
FIG. 4A illustrates a schematic diagram of another structure of the MoM capacitor in a heterogeneous integration capacitor according to an embodiment of the disclosure.
Figure 4B:
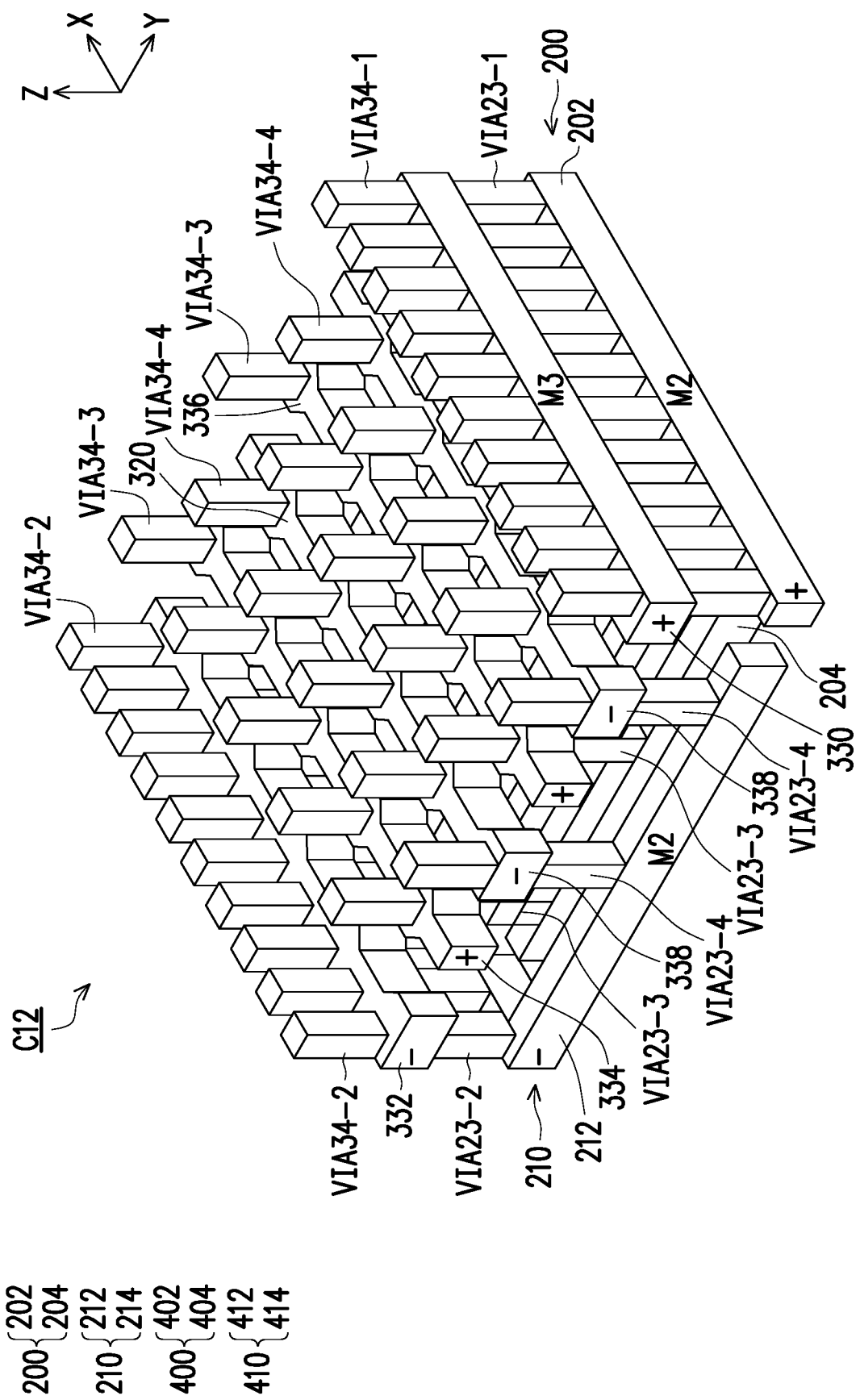
FIG. 4B illustrates a schematic diagram of a structure omitting a metal layer M4 in FIG. 4A.
Figure 4C:
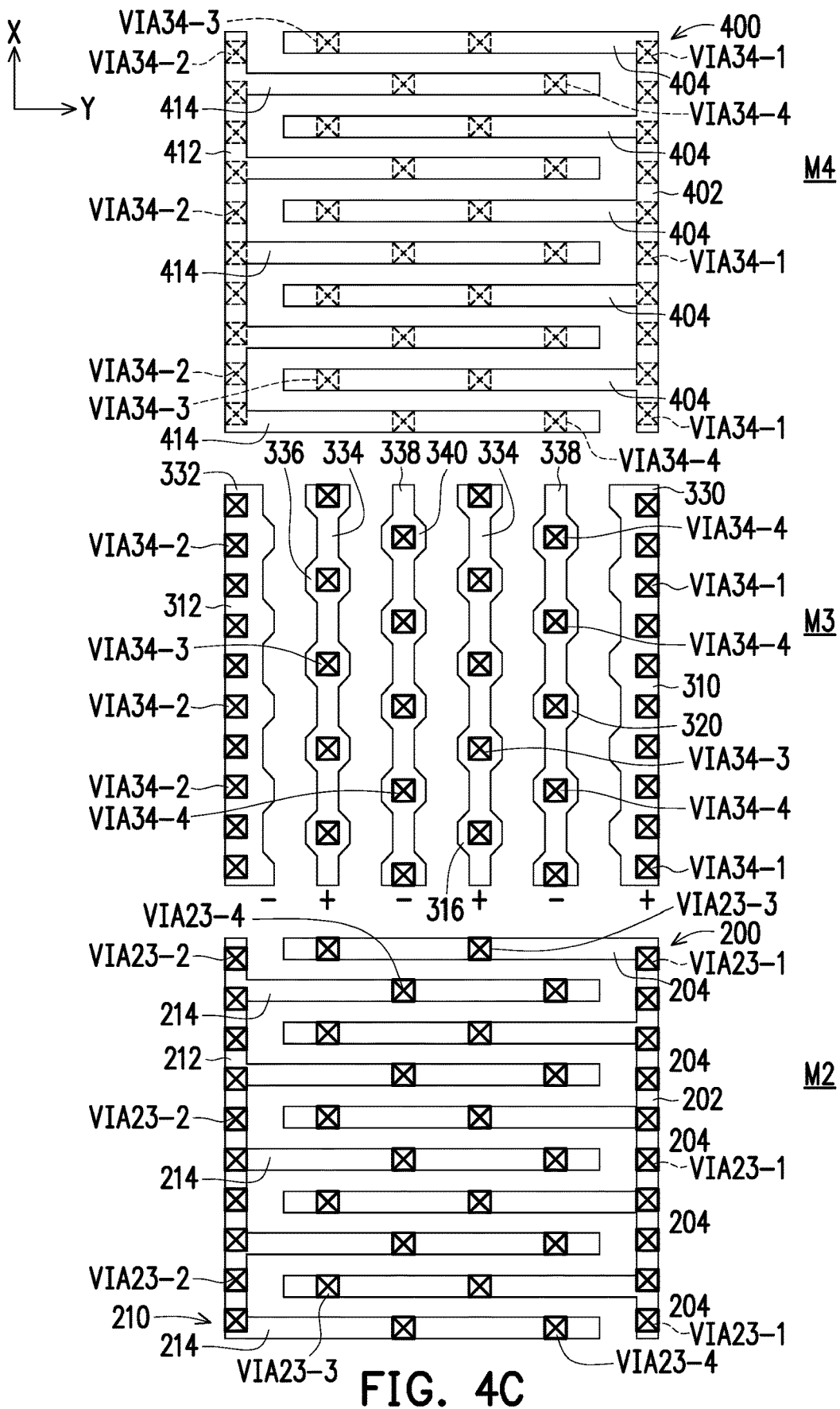
FIG. 4C illustrates a top view of each layer structure of the MoM capacitor in FIG. 4A.

FIG. 4A illustrates a schematic diagram of another structure of the MoM capacitor in the heterogeneous integration capacitor according to an embodiment of the disclosure. FIG. 4B illustrates a schematic diagram of a structure omitting the metal layer M4 in FIG. 4A. FIG. 4C illustrates a top view of each layer structure of the MoM capacitor in FIG. 4A. From FIG. 4B, we may clearly see the structure of the metal layer M3 and the disposition manner of the vias.

In this embodiment, the structures of the metal layer M2 and the metal layer M4 are basically the same as the structures shown in FIG. 3A and FIG. 3B, and the following description will use the same reference numerals or symbols, and the description thereof will be omitted. In the following description, the metal layer M3 will be used as the object of description. Similarly, oxidation layers are formed between the metal layer M2 and the metal layer M3 and between the metal layer M3 and the metal layer M4 to be used as dielectric layers of the MoM capacitor C12.

As shown in FIG. 4A to FIG. 4C, the metal layer M3 includes a first extension portion 330, a second extension portion 332, a plurality of third extension portions 334, and a plurality of fourth extension portions 338. The extension portions 330, 332, 334, and 338 are arranged along the X direction, approximately orthogonal to an extending direction (the Y direction) of the plurality of first extension portions 404 and the plurality of second extension portions 414 of the metal layer M4, and approximately orthogonal to an extending direction (the Y direction) of the plurality of first extension portions 204 and the plurality of second extension portions 214 of the metal layer M2, and of course may also be inclined at an angle with respect to each other.

The first extension portion 330 is approximately positioned below and may be aligned with the first body portion 402 of the first comb-like portion 400 of the metal layer M4, and is approximately positioned above and may be aligned with the first body portion 202 of the first comb-like portion 200 of the metal layer M2. Similarly, the second extension portion 332 is approximately positioned below and may be aligned with the second body portion 412 of the second comb-like portion 410 of the metal layer M4, and is approximately positioned above and may be aligned with the second body portion 212 of the second comb-like portion 210 of the metal layer M2.

As shown in FIG. 4B and FIG. 4C, the plurality of vias VIA34-1 are formed on the first extension portion 330, which are electrically connected upward to the first body portion 402 of the first comb-like portion 400 of the metal layer M4 (in FIG. 4C, parts marked by dotted lines in M4). In addition, the plurality of vias VIA23-1 are formed under the first extension portion 330, which are electrically connected downward to the first body portion 202 of the first comb-like portion 200 of the metal layer M2 (in FIG. 4C, parts marked by dotted lines in M2). In addition, the plurality of vias VIA34-2 are formed on the second extension portion 332, which are electrically connected upward to the second body portion 412 of the second comb-like portion 410 of the metal layer M4 (in FIG. 4C, parts marked by dotted lines in M4). In addition, the plurality of vias VIA23-2 are formed under the second extension portion 332, which are electrically connected downward to the second body portion 212 of the second comb-like portion 210 of the metal layer M2 (in FIG. 4C, parts marked by dotted lines in M2). Thereby, the positive electrode of the MoM capacitor C12 may be electrically connected to the positive electrode of the MiM capacitor C11 and the positive electrode of the MOS capacitor C13, and the negative electrode of the MoM capacitor C12 may be electrically connected to the negative electrode of the MiM capacitor C11 and the negative electrode of the MOS capacitor C13. In this way, the MiM capacitor C11, the MoM capacitor C12, and the MOS capacitor C13 are connected in parallel as the heterogeneous integration capacitor 100.

Also, each of the plurality of third extension portions 334 and each of the plurality of fourth extension portions 338 are arranged alternately with each other. As described later, each of the plurality of third extension portions 334 and each of the plurality of fourth extension portions 338 are electrically connected to different electrodes via vias respectively. For example, vias on the plurality of third extension portions 334 may be connected to positive electrodes and vias on the plurality of fourth extension portions 338 may be connected to negative electrodes. Thereby, vias of different electrodes are separated by oxidation layers, and more capacitors may be formed to increase the capacitance of the MoM capacitor C12.

Each of the plurality of third extension portions 334 includes a plurality of wide portions 336 approximately positioned at intersections of the third extension portion 334 and the first extension portion 404 of the metal layer M4 (and the first extension portion 204 of the metal layer M2). The wide portion 336 has a width wider than widths of other parts in the Y direction, so that a plurality of via VIA34-3 are respectively landed on the upper side of each wide portion 336, and a plurality of via VIA23-3 are respectively landed on a lower side of each wide portion 336. In addition, through the plurality of vias VIA34-3, the plurality of third extension portions 334 may be electrically connected upward to the plurality of first extension portions 404 of the first comb-like portion 400 of the metal layer M4. Similarly, through the plurality of vias VIA23-3, the plurality of third extension portions 334 may be electrically connected downward to the plurality of first extension portions 204 of the first comb-like portion 200 of the metal layer M2.

Similarly, each of the plurality of fourth extension portions 338 includes a plurality of wide portions 340 approximately positioned at intersections of the respective fourth extension portions 338 and the second extension portion 414 of the metal layer M4 (and the second extension portion 214 of the metal layer M2). The wide portion 340 has a wider width than widths of other parts in the Y direction, so that the plurality of vias VIA34-4 may be respectively landed on upper sides of each wide portion 340, and the plurality of vias VIA23-4 may be respectively landed on each lower side of the wide portion 340. In addition, through the plurality of vias VIA34-4, the plurality of fourth extension portions 338 may be electrically connected upward to the plurality of second extension portions 414 of the second comb-like portion 410 of the metal layer M4. Similarly, through the plurality of vias VIA23-4, the plurality of fourth extension portions 338 may be electrically connected downward to the plurality of second extension portions 214 of the second comb-like portion 210 of the metal layer M2.

Under the above-mentioned structure, the plurality of third extension portions 334 may be connected upward to a part electrically connected to the positive electrode of the metal layer M4 through the vias VIA34-3 and connected downward to a part electrically connected to the positive electrode of the metal layer M2 through the vias VIA23-3. Similarly, the plurality of fourth extension portions 338 may also be connected upward to a part electrically connected to the negative electrode of the metal layer M4 through the vias VIA34-4 and connected downward to a part electrically connected to the negative electrode of the metal layer M2 through the vias VIA23-4.

In this embodiment, at each wide portion 336 of each third extension portion 334 of the metal layer M3, the number of vias VIA23-3 electrically connected downward to the respective first extension portions 204 of the metal layer M is equal to the number of the vias VIA34-3 electrically connected upward to the respective first extension portions 404 of the metal layer M4. In addition, at each wide portion 340 of the fourth extension portion 338 of the metal layer M3, the number of vias VIA23-4 electrically connected downward to the respective second extension portions 214 of the metal layer M2 is equal to the number of the vias VIA34-4 electrically connected upward to the respective second extension portions 414 of the metal layer M4.

Under this structure, compared with the MoM capacitor in the standard CMOS process (the structure shown in FIG. 3A and FIG. 3B), side wall areas between the vias VIA34-3 and VIA34-4 and between the vias VIA23-3 and VIA23-4 of the MoM capacitor C12 shown in FIG. 4A to FIG. 4C are increased, and the coupling capacitance is increased through the vias VIA34-3, VIA34-4, VIA23-3, and VIA23-4. In this way, the unit area capacitance of the heterogeneous integration capacitor 100 can be further increased. Table 2 below lists a comparison of the heterogeneous integration capacitor 100 comprising the MoM capacitor C12 in FIG. 4A to FIG. 4C and the US Patent Publication US2016/0260706 as the related art.

TABLE 2

Comparison of capacitance value and quality factor simulation results

|  | Area (μm × μm) | Simulation result (pF) | Unit capacitance (pF/μm2) | Quality factor |
|---|---|---|---|---|
| U.S. patent | 6.33 × 5.32 | 0.0155922 | 0.000463012 | 198 |
| Heterogeneous integration capacitor | 4.2 × 5.215 | 0.011554 | 0.000527508 | 203 |

Figure 5A:
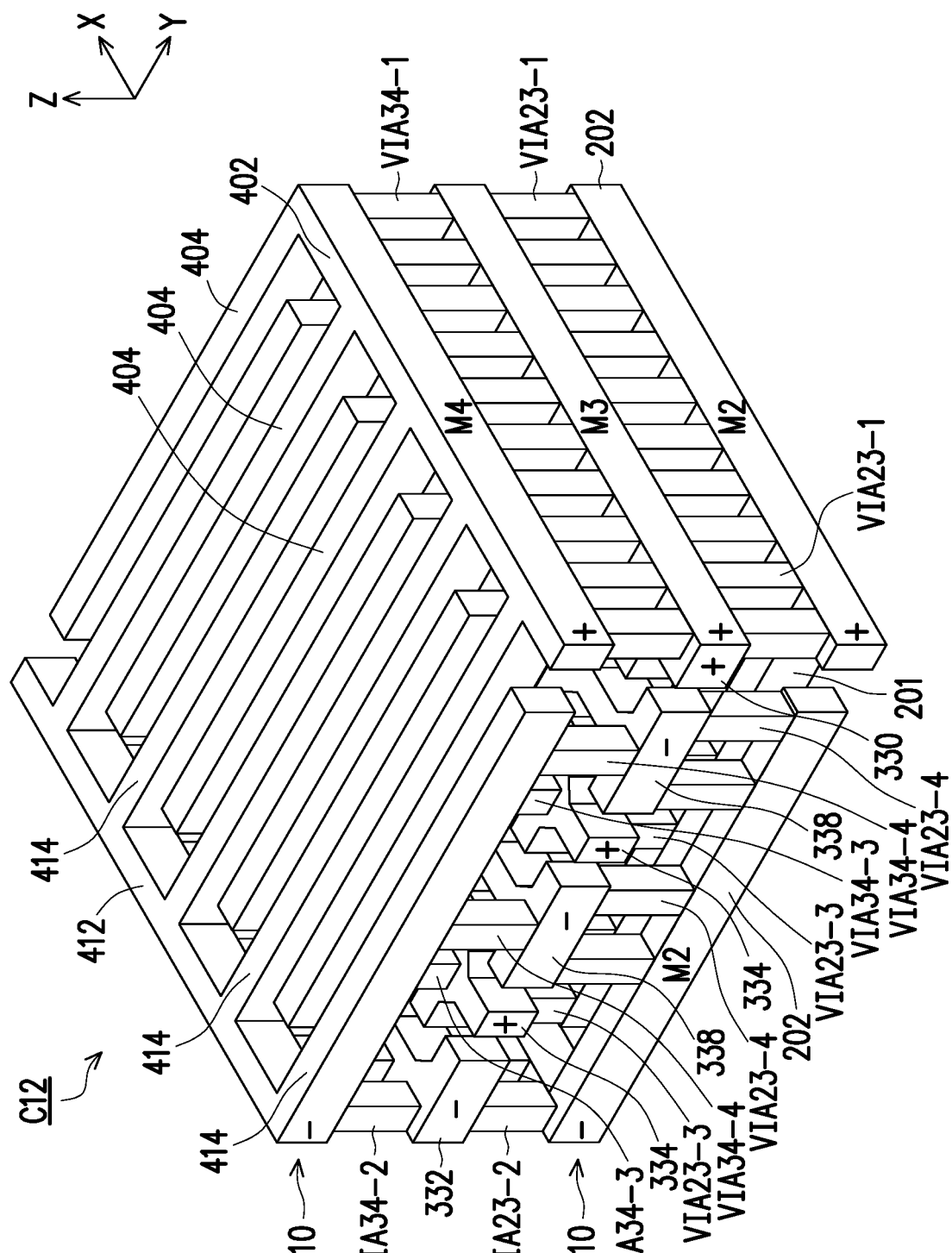
FIG. 5A illustrates a schematic diagram of another structure of the MoM capacitor in a heterogeneous integration capacitor according to an embodiment of the disclosure.
Figure 5B:
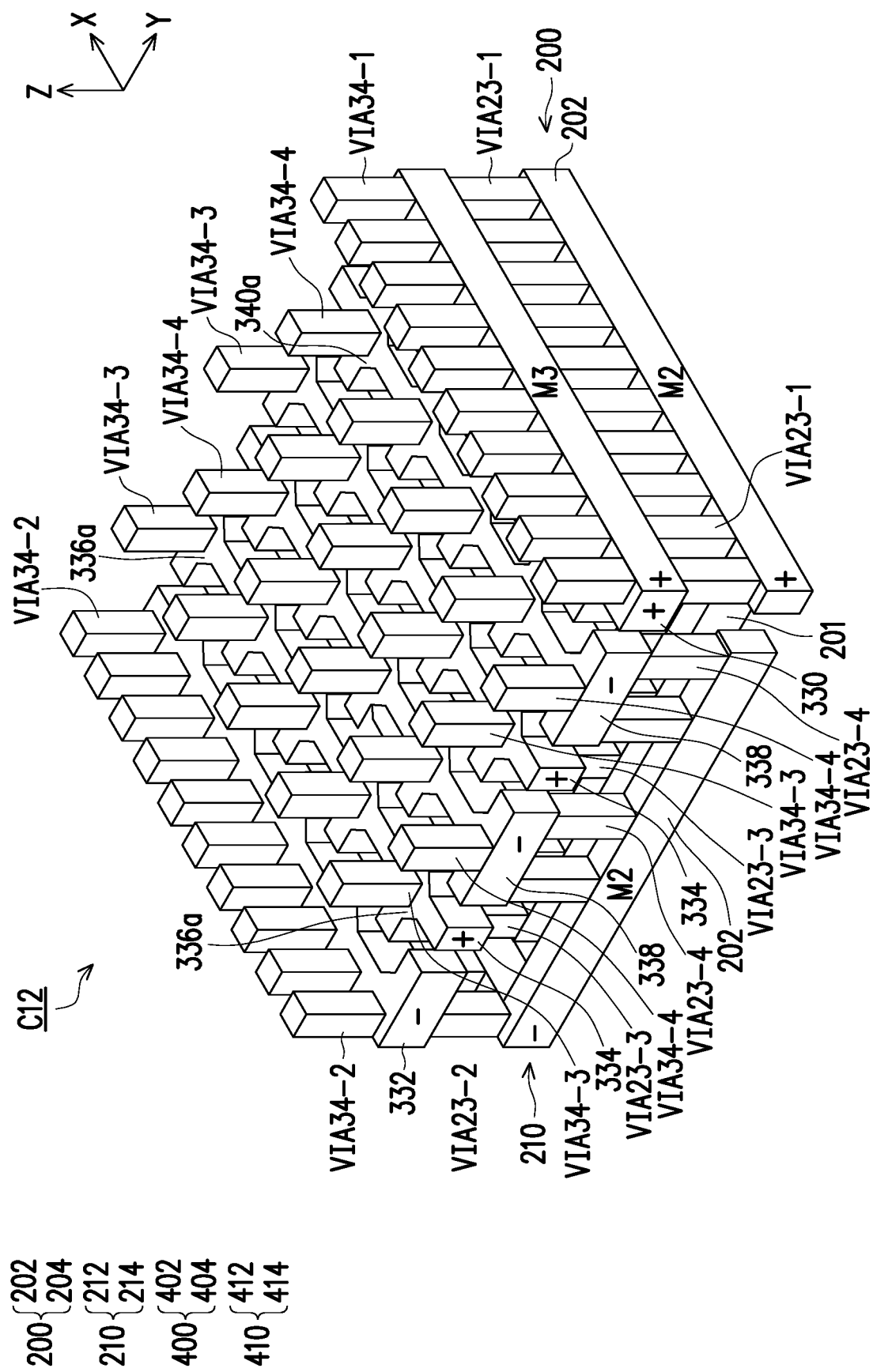
FIG. 5B illustrates a schematic diagram of a structure omitting the metal layer M4 in FIG. 5A.
Figure 5C:
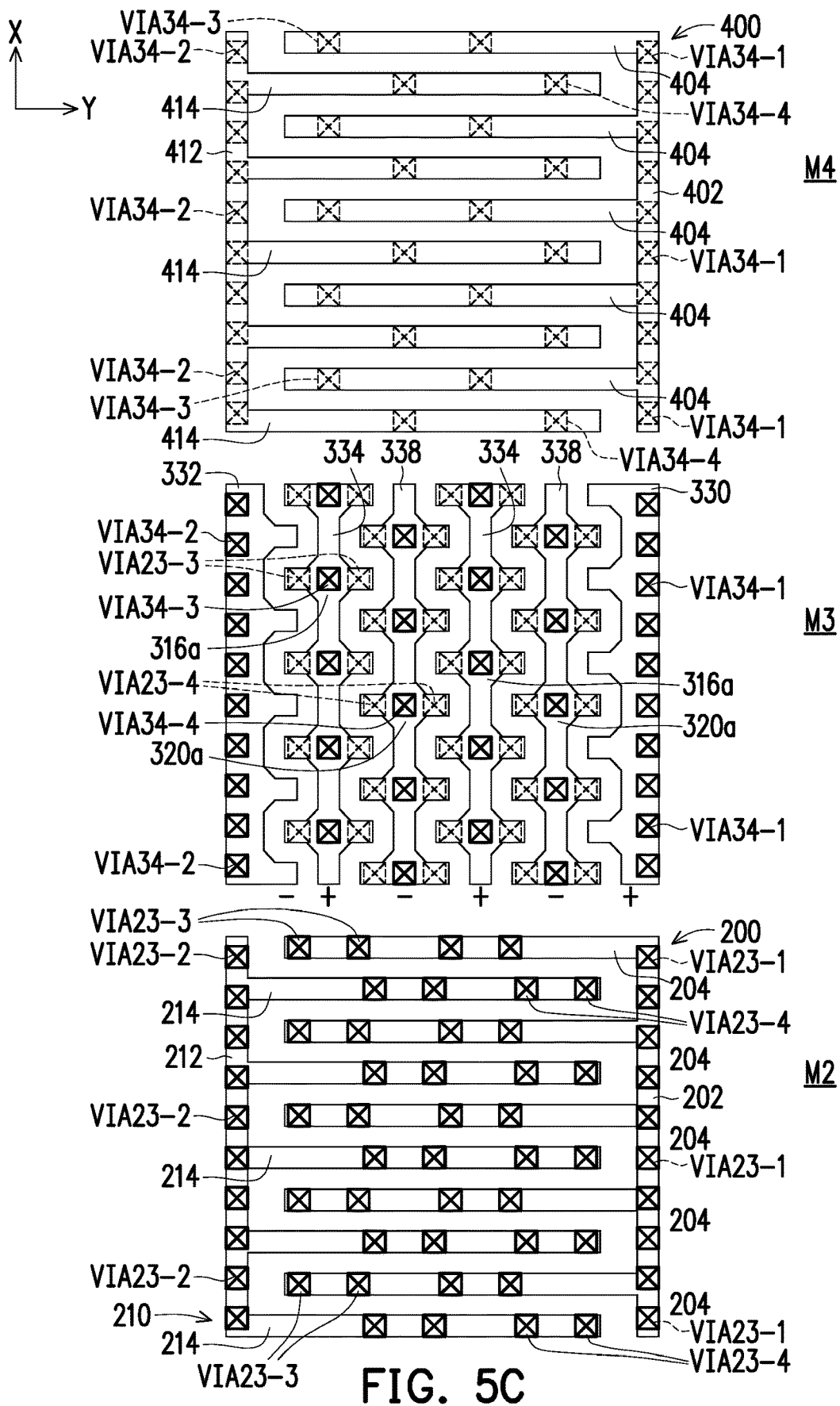
FIG. 5C illustrates a top view diagram of a metal layer M3 in FIG. 5A.

FIG. 5A illustrates a schematic diagram of another structure of the MoM capacitor in a heterogeneous integration capacitor according to an embodiment of the disclosure. FIG. 5B illustrates a schematic diagram of a structure omitting the metal layer M4 in FIG. 5A. FIG. 5C illustrates a top view diagram of the metal layer M3 in FIG. 5A. From FIG. 5B, we may clearly see the structure of the metal layer M3 and the disposition manner of the vias. The difference between the structure of the MoM capacitor C12 shown in FIG. 5A to FIG. 5C and the MoM capacitor C12 shown in FIG. 4A to FIG. 4C lies in the structure of the metal layer M3 and the number of vias. This point will be described below, and the structures of the metal layer M2 and the metal layer M4 are basically the same. The following description will use the same reference numerals or symbols, and the description thereof will be omitted. In the following description, the metal layer M3 will be used as the object of description. Similarly, oxidation layers are formed between the metal layer M2 and the metal layer M3 and between the metal layer M3 and the metal layer M4 to be used as dielectric layers of the MoM capacitor C12.

Referring to FIG. 5C, the plurality of third extension portions 334 of the metal layer M3 have a plurality of wide portions 336a, and the plurality of fourth extension portions 338 have a plurality of wide portions 340a. Widths of the wide portion 336a and the wide portion 340a are wider than the wide portion 336 and the wide portion 340 shown in FIG. 4C. Thereby, at each of the plurality of third extension portions 334 of the metal layer M3, the width of each of the plurality of wide portions 336a is sufficient to allow at least two of the plurality of vias to land on each of the plurality of first extension portions 204 of the metal layer M2. In addition, at each of the plurality of fourth extension portions 338 of the metal layer M3, the width of each of the plurality of wide portion 340a is sufficient to allow at least two of the plurality of vias to land on each of the plurality of second extension portions 214 of the metal layer M2.

In this example, the wide portion 336a of the metal layer M3 is electrically connected upward to the first extension portion 404 of the metal layer M4 by one of the vias VIA34-3, and electrically connected downward to the first extension portion 204 of the metal layer M2 by two of the vias VIA23-3. In addition, the wide portion 340a of the metal layer M3 is electrically connected upward to the second extension portion 414 of the metal layer M4 by one of the vias VIA34-4, and electrically connected downward to the second extension portion 214 of the metal layer M2 by two of the vias VIA23-4.

In this embodiment, at each wide portion 336a of each third extension portion 334 of the metal layer M3, the number (in this example, two) of the vias VIA23-3 electrically connected downward to the respective first extension portions 204 of the second metal layer M2 is not equal to (in this example, greater than) the number (in this example, one) of the vias VIA34-3 electrically connected upward to the respective first extension portions 404 of the metal layer M4. In addition, at each wide portion 340a of the fourth extension portion 338 of the metal layer M3, the number (in this example, two) of the vias VIA23-4 electrically connected downward to the respective second extension portions 214 of the metal layer M2 is not equal to (in this example, greater than) the number (in this example, one) of the vias VIA34-4 electrically connected upward to the respective second extension portions 414 of the metal layer M4.

Under this structure, compared with the MoM capacitors in the standard CMOS process (the structure shown in FIG. 3A and FIG. 3B), side wall areas between the vias VIA34-3 and VIA34-4 and between the vias VIA23-3 and VIA23-4 of the MoM capacitor C12 shown in FIG. 5A to FIG. 5C are increased, and the coupling capacitance is increased through the vias VIA34-3, VIA34-4, VIA23-3, and VIA23-4. In this way, the unit area capacitance value of the heterogeneous integration capacitor 100 can be further increased. Table 3 below lists a comparison of the heterogeneous integration capacitor 100 comprising the MoM capacitor C12 in FIG. 5A to FIG. 5C and the US Patent Publication US2016/0260706 as the related art.

TABLE 3

Comparison of capacitance value and quality factor simulation results with low wire resistance and high capacitance density

|  | Area (μm × μm) | Simulation result (pF) | Unit capacitance (pF/μm2) | Quality factor |
|---|---|---|---|---|
| U.S. patent | 6.33 × 5.32 | 0.0155922 | 0.000463012 | 198 |
| Heterogeneous integration capacitor | 4.2 × 5.765 | 0.020852 | 0.00086119 | 392 |

Figure 6:
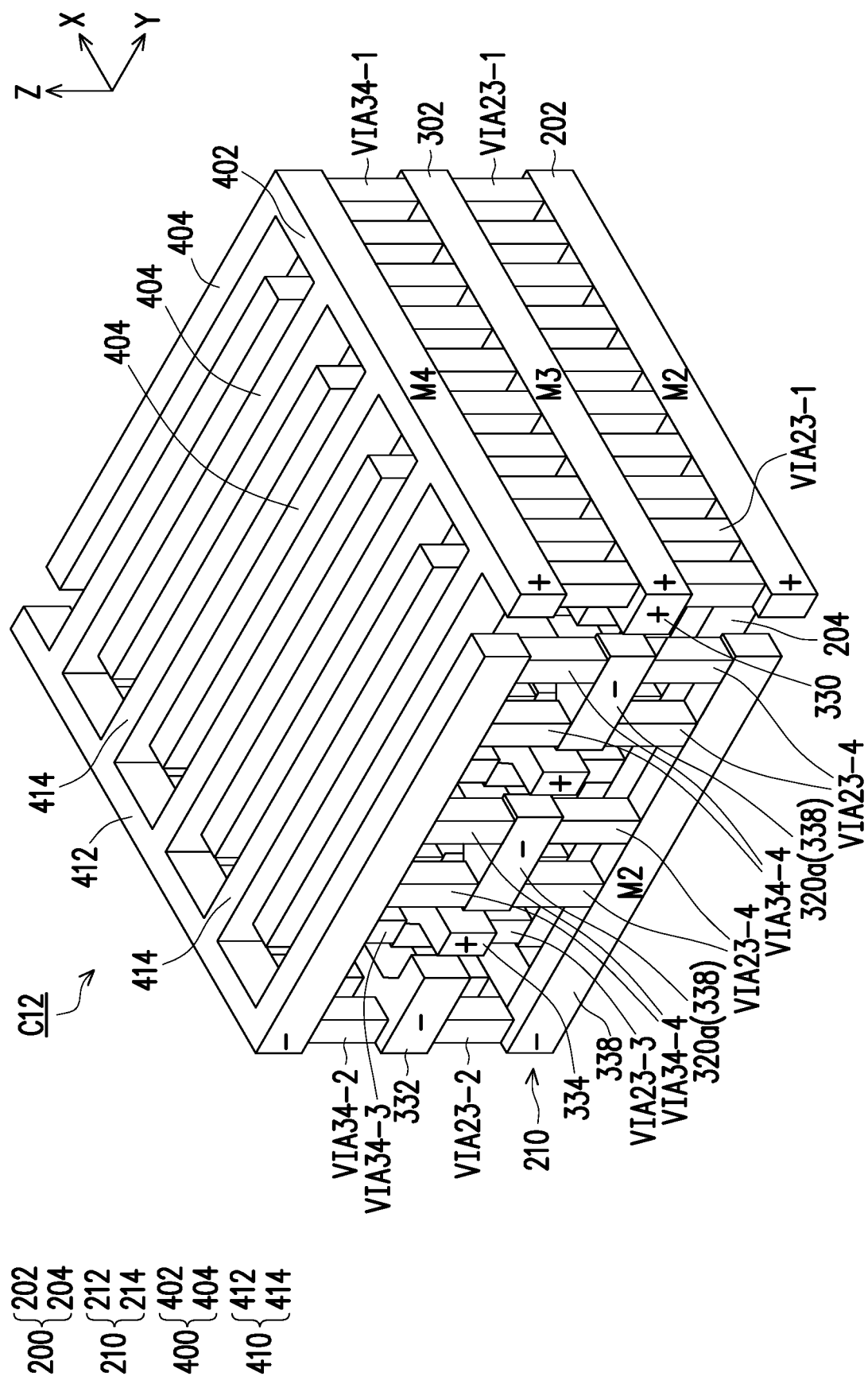
FIG. 6 illustrates a schematic diagram of another structure of the MoM capacitor in a heterogeneous integration capacitor according to an embodiment of the disclosure.

FIG. 6 illustrates a schematic diagram of another structure of the MoM capacitor in the heterogeneous integration capacitor according to an embodiment of the disclosure. FIG. 6 exemplifies a modification example of FIG. 5A to FIG. 5C. The following only describes the differences.

As shown in FIG. 6, in this example, the number of the vias VIA34-3 and VIA34-4 is further increased (doubled). That is, at each wide portion 336a of each third extension portion 334 of the metal layer M3, the number of vias VIA23-3 electrically connected downward to the respective first extension portions 204 of the metal layer M2 is two, and the number of the vias VIA34-3 electrically connected upward to the respective first extension portions 404 of the metal layer M4 is two. In addition, at each wide portion 340a of the fourth extension portion 338 of the metal layer M3, the number of vias VIA23-4 electrically connected downward to the respective second extension portions 214 of the metal layer M2 is two, and the number of the vias VIA34-4 electrically connected upward to the respective second extension portions 414 of the metal layer M4 is two.

Therefore, according to the embodiment of the disclosure, the number of vias may be increased according to design rules, and the number and the number of layers at which vias are positioned are not limited. The greater the number of vias, the greater the final unit area capacitance value.

In summary, according to the heterogeneous integration capacitor of the disclosure, a capacitor with a high unit capacitance value may be provided by integrating the three types of capacitors of the MiM capacitor, the MoM capacitor, and the semiconductor capacitor connected in parallel, so that the grain size is reduced, and the capacitance value and the quality factor thereof can be improved. In addition, the heterogeneous integration capacitor of the disclosure can reduce the circuit board material of the circuit packaging, and at the same time reduce the parasitic effect and the cost of external capacitor. In addition, the heterogeneous integration capacitor of the disclosure can also be applied to capacitive components on printed circuit boards.

What is claimed is:

1. A heterogeneous integration capacitor having a first electrode and a second electrode, wherein the heterogeneous integration capacitor comprises:
   a substrate;
   a semiconductor capacitor;
   a metal-oxide-metal (MoM) capacitor; and
   a metal-insulator-metal (MiM) capacitor,
   wherein the semiconductor capacitor, the MoM capacitor, and the MiM capacitor are sequentially formed on the substrate,
   the semiconductor capacitor, the MoM capacitor, and the MiM capacitor are formed as connected in parallel,
   wherein the MoM capacitor comprises:
   a first metal layer comprising a first comb-like portion and a second comb-like portion, wherein the first comb-like portion comprises a first body portion extending in a first direction and a plurality of first extension portions extending in a second direction, the second comb-like portion comprises a second body portion extending in the first direction and a plurality of second extension portions extending in the second direction, each of the plurality of first extension portions and each of the plurality of second extension portions are arranged alternately with each other, and the first direction is approximately orthogonal to the second direction;
   a second metal layer positioned above the first metal layer, wherein the second metal layer comprises a first comb-like portion and a second comb-like portion, the first comb-like portion comprises a first body portion extending in the first direction and a plurality of first extension portions extending in the second direction, the second comb-like portion comprises a second body portion extending in the first direction and a plurality of second extension portions extending in the second direction, and each of the plurality of first extension portions and each of the plurality of second extension portions are arranged alternately with each other;
   a third metal layer positioned above the second metal layer, wherein the third metal layer comprises a first comb-like portion and a second comb-like portion, the first comb-like portion comprises a first body portion extending in the first direction and a plurality of first extension portions extending in the second direction, the second comb-like portion comprises a second body portion extending in the first direction and a plurality of second extension portions extending in the second direction, and each of the plurality of first extension portions and each of the plurality of second extension portions are arranged alternately with each other; and
   oxidation layers positioned between the first metal layer and the second metal layer and between the second metal layer and the third metal layer,
   wherein the first body portion of the first comb-like portion of the first metal layer and the first body portion of the first comb-like portion of the second metal layer are electrically connected to each other through a plurality of vias, and the first body portion of the first comb-like portion of the second metal layer and the first body portion of the first comb-like portion of the third metal layer are electrically connected to each other through a plurality of vias, thereby the respective first body portions of the first metal layer, the second metal layer, and the third metal layer are electrically connected to the first electrode of the heterogeneous integration capacitor,
   wherein the second body portion of the second comb-like portion of the first metal layer and the second body portion of the second comb-like portion of the second metal layer are electrically connected to each other through a plurality of vias, and the second body portion of the second comb-like portion of the second metal layer and the second body portion of the second comb-like portion of the third metal layer are electrically connected to each other through a plurality of vias, thereby the respective second body portions of the first metal layer, the second metal layer, and the third metal layer are electrically connected to the second electrode of the heterogeneous integration capacitor.

2. A heterogeneous integration capacitor having a first electrode and a second electrode, wherein the heterogeneous integration capacitor comprises:
   a substrate;
   a semiconductor capacitor;
   a metal-oxide-metal (MoM) capacitor; and
   a metal-insulator-metal (MiM) capacitor,
   wherein the semiconductor capacitor, the MoM capacitor, and the MiM capacitor are sequentially formed on the substrate,
   the semiconductor capacitor, the MoM capacitor, and the MiM capacitor are formed as connected in parallel,
   wherein the MoM capacitor comprises:
   a first metal layer comprising a first comb-like portion and a second comb-like portion, wherein the first comb-like portion comprises a first body portion extending in a first direction and a plurality of first extension portions extending in a second direction, the second comb-like portion comprises a second body portion extending in the first direction and a plurality of second extension portions extending in the second direction, each of the plurality of first extension portions and each of the plurality of second extension portions are arranged alternately with each other, and the first direction is approximately orthogonal to the second direction;
   a second metal layer positioned above the first metal layer, wherein the second metal layer comprises a first extension portion, a second extension portion, a plurality of third extension portions between the first extension portion and the second extension portion, and a plurality of fourth extension portions between the first extension portion and the second extension portion, the first extension portion, the second extension portion, the plurality of third extension portions, and the plurality of fourth extension portions extend in the first direction, and each of the plurality of third extension portions and each of the plurality of fourth extension portions are arranged alternately with each other;
   a third metal layer positioned above the second metal layer, wherein the third metal layer comprises a first comb-like portion and a second comb-like portion, the first comb-like portion comprises a first body portion extending in the first direction and a plurality of first extension portions extending in the second direction, the second comb-like portion comprises a second body portion extending in the first direction and a plurality of second extension portions extending in the second direction, and each of the plurality of first extension portions and each of the plurality of second extension portions are arranged alternately with each other; and oxidation layers positioned between the first metal layer and the second metal layer and between the second metal layer and the third metal layer, wherein the first body portion of the first comb-like portion of the first metal layer and the first extension portion of the second metal layer are electrically connected to each other through a plurality of vias, and the first extension portion of the second metal layer and the first body portion of the first comb-like portion of the third metal layer are electrically connected to each other through a plurality of vias, thereby the first body portion of the first metal layer, the first extension portion of the second metal layer, and the first body portion of the third metal layer are electrically connected to the first electrode of the heterogeneous integration capacitor, wherein the second body portion of the second comb-like portion of the first metal layer and the second extension portion of the second metal layer are electrically connected to each other through a plurality of vias, and the second extension portion of the second metal layer and the second body portion of the second comb-like portion of the third metal layer are electrically connected to each other through a plurality of vias, thereby the second body portion of the first metal layer, the second extension portion of the second metal layer, and the second body portion of the third metal layer are electrically connected to the second electrode of the heterogeneous integration capacitor, wherein intersections of the respective first extension portions of the first metal layer and the respective third extension portions of the second metal layer are electrically connected to each other through a plurality of vias, and intersections of the respective third extension portions of the second metal layer and the respective first extension portions of the third metal layer are electrically connected to each other through a plurality of vias, wherein intersections of the respective second extension portions of the first metal layer and the respective fourth extension portions of the second metal layer are electrically connected to each other through a plurality of vias, and intersections of the respective fourth extension portions of the second metal layer and the respective second extension portions of the third metal layer are electrically connected to each other through a plurality of vias.

3. The heterogeneous integration capacitor according to claim 2, wherein each of the plurality of third extension portions of the second metal layer comprises a plurality of wide portions, each of the plurality of wide portions allows the via to land, and each of the plurality of fourth extension portions of the second metal layer comprises a plurality of wide portions, each of the plurality of wide portions allows the via to land.

4. The heterogeneous integration capacitor according to claim 3, wherein at each of the plurality of third extension portions of the second metal layer, the width of each of the plurality of wide portions is sufficient to allow at least two of the plurality of vias to land, and at each of the plurality of fourth extension portions of the second metal layer, the width of each of the plurality of wide portions is sufficient to allow at least two of the plurality of vias to land.

5. The heterogeneous integration capacitor according to claim 4, wherein at each of the plurality of wide portions of each of the plurality of third extension portions, the number of vias electrically connected downward to the respective first extension portions of the first metal layer is equal to the number of vias electrically connected upward to the respective first extension portions of the third metal layer, and at each of the plurality of wide portions of each of the plurality of fourth extension portions, the number of vias electrically connected downward to the respective second extension portions of the first metal layer is equal to the number of vias electrically connected upward to the respective second extension portions of the third metal layer.

6. The heterogeneous integration capacitor according to claim 4, wherein at each of the plurality of wide portions of each of the plurality of third extension portions, the number of vias electrically connected downward to the respective first extension portions of the first metal layer is not equal to the number of vias electrically connected upward to the respective first extension portions of the third metal layer, and at each of the plurality of wide portions of each of the plurality of fourth extension portions, the number of vias electrically connected downward to the respective second extension portions of the first metal layer is not equal to the number of vias electrically connected upward to the respective second extension portions of the third metal layer.

7. The heterogeneous integration capacitor according to claim 1, wherein the semiconductor capacitor is a metal-oxide-semiconductor (MOS) capacitor, and the MOS capacitor comprises:

a diffusion layer positioned in a well region of the substrate, wherein a doping type of the diffusion layer is different from the well region, the diffusion layer is used as an electrode of the MOS capacitor, and is electrically connected to the first electrode of the heterogeneous integration capacitor;

a polysilicon layer positioned above the diffusion layer, wherein the polysilicon layer is used as another electrode of the MOS capacitor, and is electrically connected to the second electrode of the heterogeneous integration capacitor; and an oxidation layer positioned between the diffusion layer and the polysilicon layer.

8. The heterogeneous integration capacitor according to claim 1, wherein the MiM capacitor comprises:

a first metal layer comprising a first part and a second part, wherein the first part is electrically connected to the first electrode of the heterogeneous integration capacitor via a via, and the second part is electrically connected to the second electrode of the heterogeneous integration capacitors via a via;

a second metal layer positioned above the first part of the first metal layer; and an insulating layer positioned between the first part of the first metal layer and the second metal layer.

9. The heterogeneous integration capacitor according to claim 1, wherein the semiconductor capacitor is a MOS capacitor, a varactor, or a depletion-type MOS capacitor.

10. A heterogeneous integration capacitor having a first electrode and a second electrode, wherein the heterogeneous integration capacitor comprises:

an MoM capacitor; and a first capacitor and a second capacitor respectively being heterogeneous structures with the MoM capacitor, and the MoM capacitor, the first capacitor, and the second capacitor are connected in parallel with each other, wherein the MoM capacitor comprises:

a first metal layer comprising a first comb-like portion and a second comb-like portion, wherein the first comb-like portion comprises a first body portion extending in a first direction and a plurality of first extension portions extending in a second direction, the second comb-like portion comprises a second body portion extending in the first direction and a plurality of second extension portions extending in the second direction, each of the plurality of first extension portions and each of the plurality of second extension portions are arranged alternately with each other, and the first direction is approximately orthogonal to the second direction;

a second metal layer positioned above the first metal layer, wherein the second metal layer comprises a first extension portion, a second extension portion, a plurality of third extension portions between the first extension portion and the second extension portion, and a plurality of fourth extension portions between the first extension portion and the second extension portion, the first extension portion, the second extension portion, the plurality of third extension portions, and the plurality of fourth extension portions extend in the first direction, and each of the plurality of third extension portions and each of the plurality of fourth extension portions are arranged alternately with each other;

a third metal layer positioned above the second metal layer, wherein the third metal layer comprises a first comb-like portion and a second comb-like portion, the first comb-like portion comprises a first body portion extending in the first direction and a plurality of first extension portions extending in the second direction, the second comb-like portion comprises a second body portion extending in the first direction and a plurality of second extension portions extending in the second direction, and each of the plurality of first extension portions and each of the plurality of second extension portions are arranged alternately with each other;

oxidation layers positioned between the first metal layer and the second metal layer and between the second metal layer and the third metal layer;

wherein the first body portion of the first comb-like portion of the first metal layer and the first extension portion of the second metal layer are electrically connected to each other through a plurality of vias, and the first extension portion of the second metal layer and the first body portion of the first comb-like portion of the third metal layer are electrically connected to each other through a plurality of vias, thereby the first body portion of the first metal layer, the first extension portion of the second metal layer, and the first body portion of the third metal layer are electrically connected to the first electrode of the heterogeneous integration capacitor, wherein the second body portion of the second comb-like portion of the first metal layer and the second extension portion of the second metal layer are electrically connected to each other through a plurality of vias, and the second extension portion of the second metal layer and the second body portion of the second comb-like portion of the third metal layer are electrically connected to each other through a plurality of vias, thereby the second body portion of the first metal layer, the second extension portion of the second metal layer, and the second body portion of the third metal layer are electrically connected to the second electrode of the heterogeneous integration capacitor, wherein intersections of the respective first extension portions of the first metal layer and the respective third extension portions of the second metal layer are electrically connected to each other through a plurality of vias, and intersections of the respective third extension portions of the second metal layer and the respective first extension portions of the third metal layer are electrically connected to each other through a plurality of vias, and wherein intersections of the respective second extension portions of the first metal layer and the respective fourth extension portions of the second metal layer are electrically connected to each other through a plurality of vias, and intersections of the respective fourth extension portions of the second metal layer and the respective second extension portions of the third metal layer are electrically connected to each other through a plurality of vias.

11. The heterogeneous integration capacitor according to claim 10, wherein each of the plurality of third extension portions of the second metal layer comprises a plurality of wide portions, each of the plurality of wide portions allows the via to land, and Each of the plurality of fourth extension portions in the second metal layer comprises a plurality of wide portions, each of the plurality of wide portions allows the via to land.

12. The heterogeneous integration capacitor according to claim 11, wherein at each of the plurality of third extension portions of the second metal layer, the width of each of the plurality of wide portions is sufficient to allow at least two of the plurality of vias to land, and at each of the plurality of fourth extension portions of the second metal layer, the width of each of the plurality of wide portions is sufficient to allow at least two of the plurality of vias to land.

13. The heterogeneous integration capacitor according to claim 12, wherein at each of the plurality of wide portions of each of the plurality of third extension portions, the number of vias electrically connected downward to the respective first extension portions of the first metal layer is equal to the number of vias electrically connected upward to the third extension portions of the third metal layer, and at each of the plurality of wide portions of each of the plurality of fourth extension portions, the number of vias electrically connected downward to the respective second extension portions of the first metal layer is equal to the number of vias electrically connected upward to the respective second extension portions of the third metal layer.

14. The heterogeneous integration capacitor according to claim 12, wherein at each of the plurality of wide portions of each of the plurality of third extension portions, the number of vias electrically connected downward to the respective first extension portions of the first metal layer is not equal to the number of vias electrically connected upward to the respective first extension portions of the third metal layer, and at each of the plurality of wide portions of each of the plurality of fourth extension portions, the number of vias electrically connected downward to the respective second extension portions of the first metal layer is not equal to the number of vias electrically connected upward to the respective second extension portions of the third metal layer.

15. An MoM capacitor, comprising:
a first metal layer comprising a first comb-like portion and a second comb-like portion, wherein the first comb-like portion comprises a first body portion extending in a first direction and a plurality of first extension portions extending in a second direction, the second comb-like portion comprises a second body portion extending in the first direction and a plurality of second extension portions extending in the second direction, each of the plurality of first extension portions and each of the plurality of second extension portions are arranged alternately with each other, and the first direction is approximately orthogonal to the second direction;
a second metal layer positioned above the first metal layer, wherein the second metal layer comprises a first extension portion, a second extension portion, a plurality of third extension portions between the first extension portion and the second extension portion, and a plurality of fourth extension portions between the first extension portion and the second extension portion, the first extension portion, the second extension portion, the plurality of third extension portions, and the plurality of fourth extension portions extend in the first direction, and each of the plurality of third extension portions and each of the plurality of fourth extension portions are arranged alternately with each other;
a third metal layer positioned above the second metal layer, wherein the third metal layer comprises a first comb-like portion and a second comb-like portion, the first comb-like portion comprises a first body portion extending in the first direction and a plurality of first extension portions extending in the second direction, the second comb-like portion comprises a second body portion extending in the first direction and a plurality of second extension portions extending in the second direction, and each of the plurality of first extension portions and each of the plurality of second extension portions are arranged alternately with each other; and
oxidation layers positioned between the first metal layer and the second metal layer and between the second metal layer and the third metal layer,
wherein the first body portion of the first comb-like portion of the first metal layer and the first extension portion of the second metal layer are electrically connected to each other through a plurality of vias, and the first extension portion of the second metal layer and the first body portion of the first comb-like portion of the third metal layer are electrically connected to each other through a plurality of vias, thereby the first body portion of the first metal, the first extension portion of the second metal layer, and the first body portion of the third metal layer are electrically connected to each other, and are used as an electrode of the MoM capacitor,
wherein the second body portion of the second comb-like portion of the first metal layer and the second extension portion of the second metal layer are electrically connected to each other through a plurality of vias, and the second extension portion of the second metal layer and the second body portion of the second comb-like portion of the third metal layer are electrically connected to each other through a plurality of vias, thereby the second body portion of the first metal layer, the second extension portion of the second metal layer, and the second body portion of the third metal layer are electrically connected, and are used as another electrode of the MoM capacitor,
wherein intersections of the respective first extension portions of the first metal layer and the respective third extension portions of the second metal layer are electrically connected to each other through a plurality of vias, and intersections of the respective third extension portions of the second metal layer and the respective first extension portions of the third metal layer are electrically connected to each other through a plurality of vias,
wherein intersections of the respective second extension portions of the first metal layer and the respective fourth extension portions of the second metal layer are electrically connected to each other through a plurality of vias, and intersections of the respective fourth extension portions of the second metal layer and the respective second extension portions of the third metal layer are electrically connected to each other through a plurality of vias.

16. The heterogeneous integration capacitor according to claim 15, wherein each of the plurality of third extension portions of the second metal layer comprises a plurality of wide portions, each of the plurality of wide portions allows the via to land, and
each of the plurality of fourth extension portions of the second metal layer comprises a plurality of wide portions, each of the plurality of wide portions allows the via to land.

17. The heterogeneous integration capacitor according to claim 16, wherein at each of the plurality of third extension portions of the second metal layer, the width of each of the plurality of wide portions is sufficient to allow at least two of the plurality of vias to land, and
at each of the plurality of fourth extension portions of the second metal layer, the width of each of the plurality of wide portions is sufficient to allow at least two of the plurality of vias to land.

18. The heterogeneous integration capacitor according to claim 16, wherein at each of the plurality of wide portions of each of the plurality of third extension portions, the number of vias electrically connected downward to the respective first extension portions of the first metal layer is equal to the number of vias electrically connected upward to the respective first extension portions of the third metal layer, and
at each of the plurality of wide portions of each of the plurality of fourth extension portions, the number of vias electrically connected downward to the respective second extension portions of the first metal layer is equal to the number of vias electrically connected upward to the respective second extension portions of the third metal layer.

19. The heterogeneous integration capacitor according to claim 16, wherein at each of the plurality of wide portions of each of the plurality of third extension portions, the number of vias electrically connected downward to the respective first extension portions of the first metal layer is not equal to the number of vias electrically connected upward to the respective first extension portions of the third metal layer, and
at each of the plurality of wide portions of each of the plurality of fourth extension portions, the number of vias electrically connected downward to the respective second extension portions of the first metal layer is not equal to the number of vias electrically connected upward to the respective second extension portions of the third metal layer.

* * * * *